US007004768B2

(12) United States Patent
Ma et al.

(10) Patent No.: US 7,004,768 B2
(45) Date of Patent: Feb. 28, 2006

(54) PICK UP CAP FOR LGA CONNECTOR ASSEMBLY

(75) Inventors: Hao-Yun Ma, Tu-Chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/894,556

(22) Filed: Jul. 19, 2004

(65) Prior Publication Data

US 2005/0014401 A1 Jan. 20, 2005

(30) Foreign Application Priority Data

Jul. 18, 2003 (TW) .............................. 92213186 U

(51) Int. Cl.
*H01R 13/44* (2006.01)

(52) U.S. Cl. ....................................... 439/135; 439/940

(58) Field of Classification Search .................. 439/41, 439/135, 331, 940, 142
See application file for complete search history.

(56) References Cited

U.S. PATENT DOCUMENTS

| | | | | |
|---|---|---|---|---|
| 4,504,105 | A * | 3/1985 | Barkus et al. | 439/331 |
| 4,560,216 | A * | 12/1985 | Egawa | 439/41 |
| 5,055,971 | A * | 10/1991 | Fudala et al. | 361/760 |
| 5,057,031 | A * | 10/1991 | Sinclair | 439/261 |
| 5,383,797 | A * | 1/1995 | Seong et al. | 439/569 |
| 5,651,684 | A * | 7/1997 | Northey et al. | 439/41 |
| 5,815,000 | A * | 9/1998 | Farnworth et al. | 324/755 |
| 6,116,949 | A * | 9/2000 | Costello et al. | 439/509 |
| 6,155,848 | A * | 12/2000 | Lin | 439/135 |
| 6,290,805 | B1 * | 9/2001 | Freund et al. | 156/344 |
| 6,439,913 | B1 * | 8/2002 | Ma | 439/342 |
| 6,478,588 | B1 * | 11/2002 | Howell et al. | 439/135 |
| 6,506,064 | B1 * | 1/2003 | Wu | 439/135 |
| 6,554,625 | B1 * | 4/2003 | Liao et al. | 439/135 |
| 6,558,174 | B1 * | 5/2003 | Hou | 439/135 |
| 6,626,691 | B1 * | 9/2003 | Yu | 439/342 |
| 6,685,494 | B1 * | 2/2004 | McHugh et al. | 439/342 |
| 6,821,127 | B1 * | 11/2004 | Lin et al. | 439/41 |
| 2005/0009377 | A1 * | 1/2005 | Liao | 439/41 |
| 2005/0112922 | A1 * | 5/2005 | Ma | 439/135 |

* cited by examiner

*Primary Examiner*—P. Austin Bradley
*Assistant Examiner*—Larisa Tsukerman
(74) *Attorney, Agent, or Firm*—Wei Te Chung

(57) ABSTRACT

A pick up cap for an LGA connector assembly, the LGA connector has an insulative housing for receiving an electronic package such as CPU therein, a plurality of electrical contacts received in the housing. A clip disposed on the housing to press the CPU upon the contacts, and a pick up cap mounted on the clip, the pick up has extending portion, and the extending portion has an uplift which defines a concave, the concave can supply a sufficiently big operating space for operator's fingertip to detach the pick up cap away from the connector.

7 Claims, 4 Drawing Sheets

PICK UP CAP FOR LGA CONNECTOR ASSEMBLY

BACKGROUND OF THE INVENTION

1. Field of the Invention

The present invention relates to a land grid (LGA) connector assembly which has an LGA connector and a pick up cap being mounted to the connector for provision of a smooth flat top surface for sucked by a vacuum suction device, thereby facilitating mounting the LGA connector assembly onto a substrate circuit such as a printed circuit board (PCB).

2. Description of the Prior Art

On many mass production lines, vacuum suction devices are often used to suck electronic components such as land grid array (LGA) connectors, and then position the connectors on substrate circuits such as printed circuit boards (PCBs). An LGA connector typically has an insulative housing, a plurality of electrical contacts received in the housing, a metal clip pivotably mounted to an end of the housing, and a lever pivotably mounted to an opposite end of the housing for engaging with the clip. The clip has four sides and a generally rectangular window in a middle thereof. Each contact has a first contact portion protruding outwardly from a top portion of the housing, for electrically connecting with a corresponding contact pad of an LGA central processing unit (CPU) respectively. In order to suck and position a LGA connector on a substrate circuit, a pick up cap is often pre-attached on the top portion of the connector. The pick up cap is a substantially rectangular plate having two extending portions extended coplanarly from two opposite sides thereof, and several latches and claps set on the other opposite two sides thereof, when the pick up cap is mounted on the clip, the latches and clasps snap corresponding two opposite sides of the clip and the two extending portion engage with the other two opposite sides of the clip, thereby attaching the pick up cap to the LGA connector. The pick up cap has a smooth flat top surface. The vacuum suction device is able to suck the flat top surface of the pick up cap, and reliably move and accurately position the LGA connector onto the PCB. After the LGA connector has been correctly mounted onto the PCB, the pick up cap will be detached from the connector, the definite procedure is that one operator uses one of his fingertip to lift a small rift between one extend portion and one side of the clip to detach the pick up cap away from the connector.

However, the operation of detaching the pick up cap from the connector may encounter some problems due to the rift, which is so small and unobvious and can not afford a sufficient operating place for being manipulated by an operator with his fingertip. Moreover operator may even attempt to detach the pick up cap by manipulating a wrong place, not exact the rift between one extend portion and one side of the clip. This often causes damage to the connector or the pick up cap.

Therefore, a new pick up cap that overcome above-mentioned disadvantages is desired.

SUMMARY OF THE INVENTION

Accordingly, an object of the present invention is to provide a pick up cap for an land grid array (LGA) connector assembly which has an LGA connector and a pick up cap mounted on the connector, wherein the pick up cap has minimal risk of damaging the connector while the pick up cap is detached from the connector.

To achieve the above-mentioned object, an LGA connector assembly in accordance with a preferred embodiment of the invention has an LGA connector and a pick up cap. The connector has an insulative housing, a plurality of electrical contacts received in the housing, and a metal clip. The housing defines a generally rectangular cavity for receiving an electronic package such as an LGA central processing unit (CPU) therein. A multiplicity of passageways is defined in a portion of the housing under the cavity, the passageways receiving corresponding contacts therein. The clip is disposed on the housing to press the CPU upon the contacts. The pick up cap is generally rectangular, and has a plurality of clasps and latches set at two opposite ends thereof, two extending portions extend coplanarly from two other opposite ends thereof. When the pick up cap is mounted onto the connector, the clasps and latches snap inner edges of two opposite sides of the clip, and the two extending portions engage the two other opposite sides of the clip firmly. Therefore the pick up cap is securely mounted onto the connector. One of the two extending portion has an uplift which defines a concave, the concave supplies a sufficient operating place for an operator' fingertip. The pick up cap provides a smooth flat top surface to be sucked by a vacuum suction device, thereby manipulating the LGA connector assembly onto a pre-determined location of a substrate circuit. When the pick up cap is to be detached from the connector, the operator extends one of his fingertips under the concave firstly, and then uplift the concave to easily and safely detach the pick up away from the connector.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
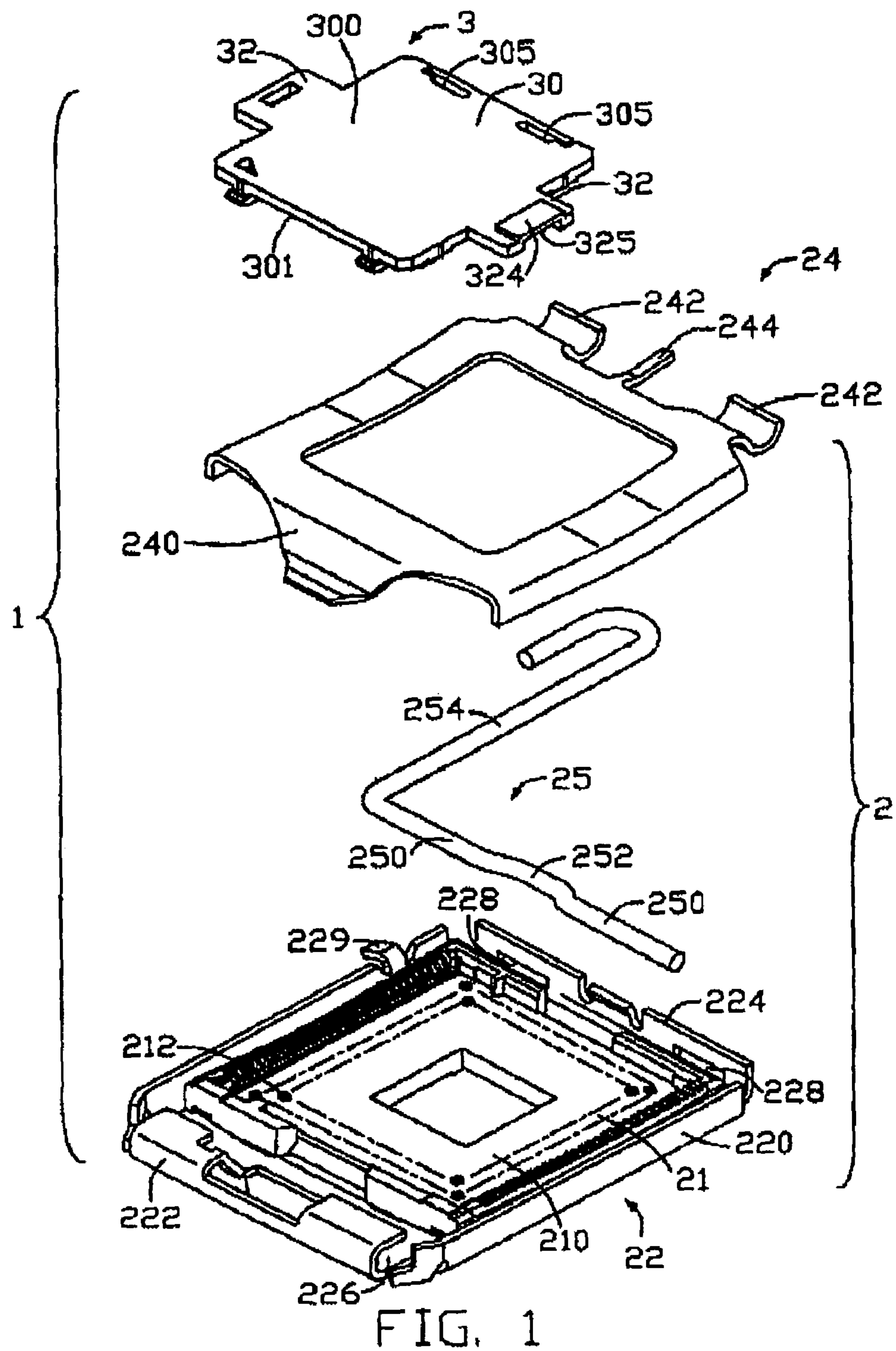
FIG. 1 is an exploded, isometric view of an LGA connector assembly of the present invention, the LGA connector assembly having an LGA connector and a pick up cap to be mounted onto the connector.

FIG. 1 shows an exploded, isometric view of a land grid array (LGA) connector assembly 1 in accordance with a preferred embodiment of the present invention. The LGA connector assembly 1 has an LGA connector 2 and a generally rectangular pick up cap 3. The pick up cap 3 is mounted onto the connector 2 for provision of a flat top surface to be sucked by a vacuum suction device, thereby facilitating manipulating the LGA connector assembly 1 onto a substrate circuit, such as a printed circuit board (PCB) (not shown), on which the connector 2 is seated.

The connector 2 has a generally rectangular insulative housing 21, a plurality of electrical contacts (not shown)

received in the housing 21, a metal stiffener 22 partly covering the housing 21 to enforce the housing 21, a lever 25 pivotably received in an end of the stiffener 22, and a metal clip 24 pivotably mounted onto an opposite end of the stiffener 22, during rotating, the lever 25 can press downwardly upon the metal clip.

Figure 4:
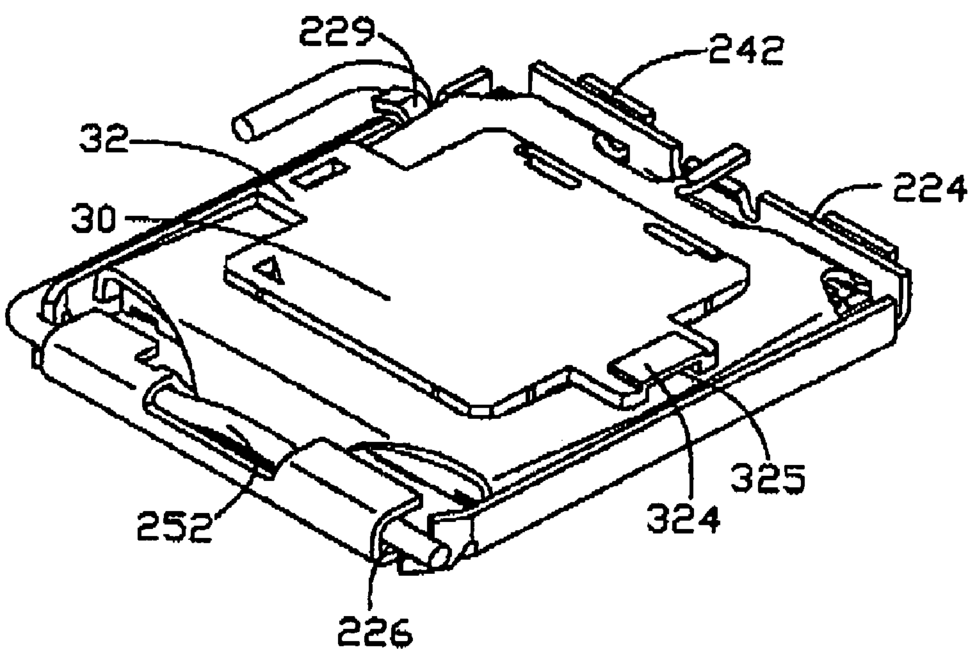
FIG. 4 is an assembled, isometric view of FIG. 1.

FIG. 4 is an assembled view of the connector 2 and the pick up cap 3. Now refer to FIG. 4 together with FIG. 1, the housing 21 defines a generally rectangular cavity 210 in a middle thereof. The cavity 210 is used for receiving an electronic package such as an LGA central processing unit (CPU) (not shown) therein. A multiplicity of passageways 212 is defined in a portion of the housing 21 under the cavity 210, the passageways 212 receiving a corresponding number of contacts (not shown) therein respectively. The stiffener 22 has a pair of L-shaped cross-sectional lateral sides 220, and a U-shaped cross-sectional front end 222 and a L-shaped cross-sectional rear end 224 interconnecting two opposite ends of the lateral sides 220 respectively. The housing 21 is received in a middle portion of the stiffener 22. An elongate chamber 226 is defined in a front end of the stiffener 22. A pair of spaced slots 228 is defined in a rear end of the stiffener 22. An ear 229 extends bendly from an edge of one L-shaped cross-sectional lateral sides 220.

The lever 25 has a pair of locating portion 250 pivotably received in the chamber 226 of the stiffener 22, an actuating portion 252 between the locating portions 250, and an operating portion 254 extending perpendicularly from an end of one of the locating portions 250, The operating portion 254 is disposed at an outside of the stiffener 22, and engages with the ear 229 when the operating portion 254 is oriented at a horizontal. The clip 24 has an engaging portion 240 extending arcuately from an end thereof, a pair of spaced securing portions 242 extending arcuately from an opposite end thereof corresponding to the slots 228 of the stiffener 22, and a tail 244 between the securing portions 242. The securing portions 242 are pivotably received in the slots 228 of the stiffener 22. When the operating portion 254 is being rotated towards the ear 229, the actuating portion 252 urges the CPU to engage with the contacts of the connector. When the clip 24 is oriented at a position perpendicularly to the top portion of the housing 21, the tail 244 abuts against the stiffener 22 to prevent the clip 24 from continuous rotation.

The pick up cap 3 has a generally rectangular planar body 30. The planar body 30 defines a smooth flat top surface 300 and a bottom surface 301 opposite to the top surface 300. Two extending portions 32 extend respectively from two opposite ends of the planar body. One of the two extending portion 32 forms a uplift 324, the uplift 324 also defines top surface and a bottom surface. The uplift 324 offsets upwardly a distance with respect to the planar body 30. The perpendicular distance from the bottom surface of the uplift 324 to the clip 24 is longer the distance from the bottom surface 301 of the extending portion 30 to the clip 24. The uplift 324 forms a concave 325 that would provide a sufficient operating place for operation's fingertip when the pick up cap 3 is detached from the connector 2.

Figure 2:
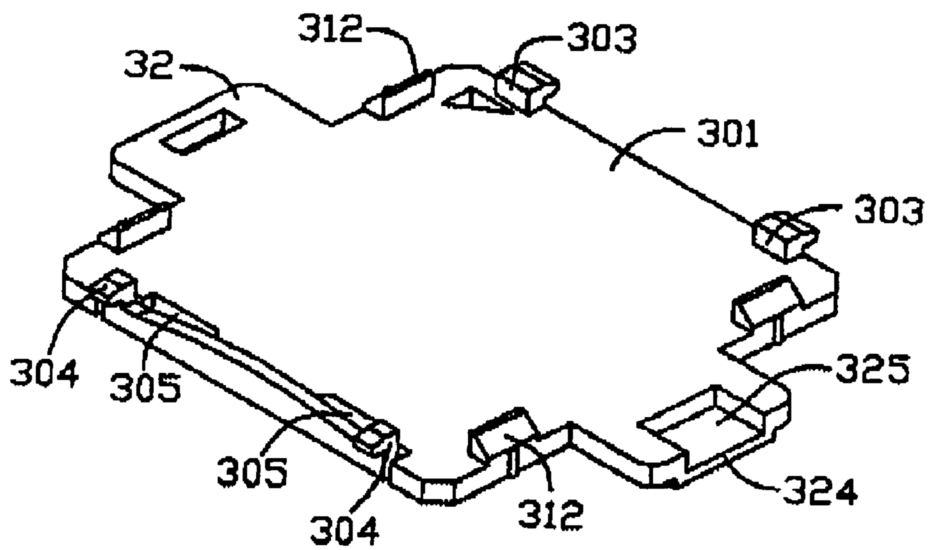
FIG. 2 is an inverted, isometric view of the pick up cap of FIG. 1.

FIG. 2 shows a bottom side view of the pick up cap 3. Four stops 312 are respectively arranged near the four corners of pick up cap 3. The four stops 312 are aimed to restrain the pick up cap 3 from moving on the connector 2. A pair of clasps 303 is formed at one end of the pick up cap 3. Each clasp 303 extends perpendicularly from the bottom surface 301 of the planar body 30 and then bends laterally for snapping one inner side of the clip 24. Opposite to the two clasps 303, a pair of latches 304 extends perpendicularly from another side of the bottom surface 301 of the planar body 30. The two latches 304 are designated to snap another inner side of the clip 24. Nearby each latch 304, there is a slot 305 defined in one end of the pick up cap 3. The two latch 304 can be elastically deflected to facilitate mounting the pick up cap 3 to the connector 2.

Figure 3:
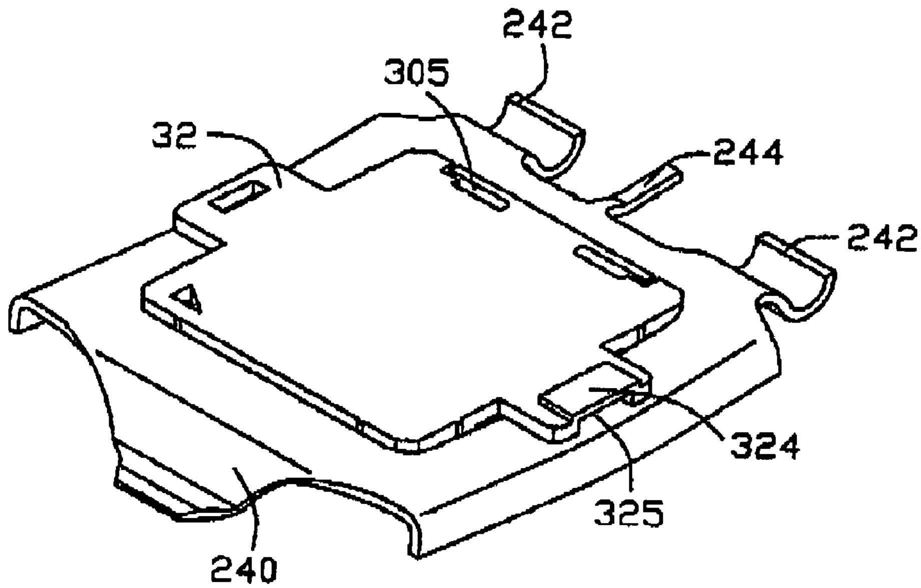
FIG. 3 is an assembled view of the pick up cap and a clip of the connector of FIG. 1, but showing from another viewing aspect.

Referring to FIGS. 3 and 4, in attaching of the pick up cap 3 onto the connector 2, the pick up cap 3 is disposed over the connector 2, with the clasps 303 and latches 304 loosely contacting corresponding edges of the clip 24 respectively, when the pick up cap 3 is pressed down, The clasps 303 and latches 304 are elastically deflected and snap the corresponding inner edges of the clip 24. At the same time, the two extending portions engage firmly with two corresponding opposites sides of the clip 24. Because the uplift 324 if offset upwardly with regard to extending portion 32, the perpendicular distances from the bottom surface of the uplift 324 to the side of the clip 24 are respectively longer than the distance form the bottom surface 301 to the side of the clip 24 which the extending portion having uplift engages with, after the pick up cap 3 is being mounted onto the connector 2. A vacuum suction device (not shown) can suck the top surface 300 of the pick up cap 3 in order to move the connector assembly 1 to a pre-determined location of the PCB.

After the connector 2 is oriented at a desired location, the following step is to detach the pick up cap 3 from the connector 2. As clarified above, the uplift 324 portion defines the concave 325 which can provide a sufficient and noticeable operating space for the operator's fingertip, operator can extend one of his fingertip into the concave 325, and raise the uplift 324 to detach the pick up 3 away from the connector 2 easily and safely.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An LGA connector assembly, comprising:

an LGA connector, comprising:

an insulative housing for receiving an electronic package therein;

a clip disposed on the housing;

a pick up cap mounted on the clip, the pick up cap has extending portion extending outwardly and horizontally, and the extending portion has an uplift which defines a concave between the uplift and the clip, the concave can supply a sufficiently big operation space for operator's fingertip, wherein a pair of claps is formed at an end of the planner body, each clasp extending perpendicularly from the bottom surface for snapping a corresponding edge of the clip of the connector;

wherein a pair of latches is formed at another end of the planar body, adjacent each latch, there is a slot set for making the two latches have a desired resilience; and wherein four stops are respectively arranged near the four corners of pick up cap, the four stops are aimed to retrain the pick up cap from moving on the connector.

2. The LGA connector assembly as claimed in claim 1, wherein the pick up cap has a generally rectangular planar body, two extending portions extend laterally from two opposite ends of the planar body.

3. The LGA connector assembly as claimed in claim 2, wherein the two extending portion engage with two opposite sides of the clip, and the operating space is located between the concave and one side of the clip.

4. The LGA connector assembly as claimed in claim 3, wherein the uplift defines a top surface and a bottom surface, the bottom surface of the uplift offset upwardly a distance with respective to the corresponding bottom surface of the extending portion which defines the uplift.

5. A pick up cap for electrical connector, said connector comprising:

an insulative housing;

a metal clip disposed on the housing;

the pick up cap mounted on the clip, the pick up has an uplift which forms a relatively sufficient operation space between the uplift and clip, by utilizing the uplift operator can remove the pick up cap away from the connector easily and safely, wherein a pair of claps is formed at an end of the planner body, each clasp extending perpendicularly from the bottom surface for snapping a corresponding edge of the clip of the connector;

wherein a pair of latches is formed at another end of the planar body, adjacent each latch, there is a slot set for making the two latches have a desired resilience; and wherein four stops are respectively arranged near the four corners of pick up cap, the four stops are aimed to retrain the pick up cap from moving on the connector.

6. The pick up cap as claimed in claim 5, wherein the pick up cap has a generally rectangular planar body, two extending portions extend laterally from two opposite ends of the planar body, and the uplift is set at one extending portion.

7. The pick up cap as claimed in claim 5, wherein both the extending portions and the uplift define a top surface and a bottom surface, and the perpendicular distance from the bottom surface of the uplift to the clip is longer than the distance from bottom surface of extending portion to the clip.

* * * * *